(12) United States Patent
Castro et al.

(10) Patent No.: US 6,501,168 B1
(45) Date of Patent: *Dec. 31, 2002

(54) SUBSTRATE FOR AN INTEGRATED CIRCUIT PACKAGE

(75) Inventors: Abram M. Castro, Fort Worth, TX (US); Aaron R. Castro, Dallas, TX (US)

(73) Assignee: Substrate Technologies, Incorporated, Carrollton, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/388,332

(22) Filed: Sep. 1, 1999

Related U.S. Application Data

(63) Continuation of application No. 09/075,286, filed on May 8, 1998, now Pat. No. 6,107,683, which is a continuation-in-part of application No. 08/879,549, filed on Jun. 20, 1997, now abandoned.

(51) Int. Cl.[7] ............................................. H01L 23/12
(52) U.S. Cl. ...................... 257/700; 257/712; 257/723; 257/737
(58) Field of Search ................................ 257/700, 712, 257/706, 707, 780, 737, 738, 778

(56) References Cited

U.S. PATENT DOCUMENTS

| 4,358,479 A | * | 11/1982 | Canestaro et al. | ............ 427/98 |
| 5,583,378 A | * | 12/1996 | Marrs et al. | ................ 257/710 |
| 5,661,086 A | * | 8/1997 | Nakashima et al. | ........ 257/668 |
| 5,789,268 A | * | 8/1998 | Chivakula et al. | ............ 437/60 |
| 6,107,683 A | * | 8/2000 | Castro et al. | ............... 257/700 |

* cited by examiner

Primary Examiner—Roy Potter
(74) Attorney, Agent, or Firm—Philip G. Meyers

(57) ABSTRACT

An enhanced ball grid array substrate package and method for manufacturing the same, where the substrate package includes a metal core having a first surface and a second surface opposite the first surface. The metal core further includes at least one cavity in which at least one integrated circuit is positioned. A dielectric layer is secured to the first surface of the metal core and includes at least one die cavity formed therein. Thereafter, a conductive seed layer is chemically deposited to exposed portions of the dielectric layer and the first surface of the metal core. Adjacent to the conductive seed layer, a circuit is electrolytically and selectively formed within a first circuit pattern.

19 Claims, 5 Drawing Sheets

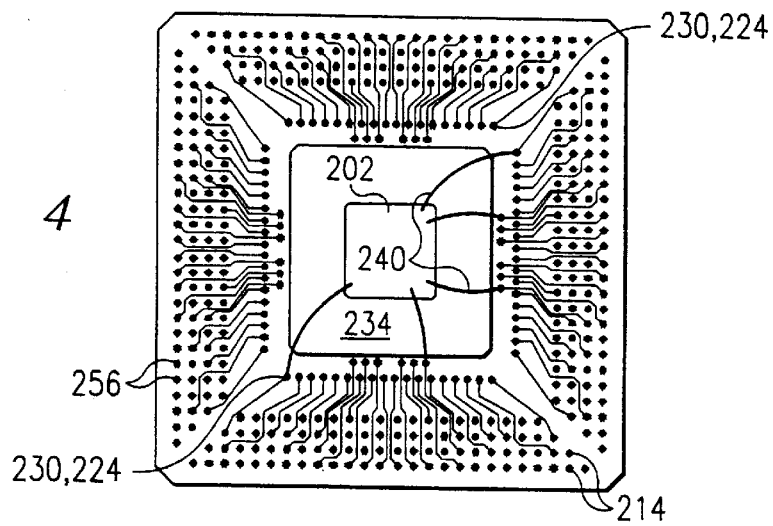
FIG. 4
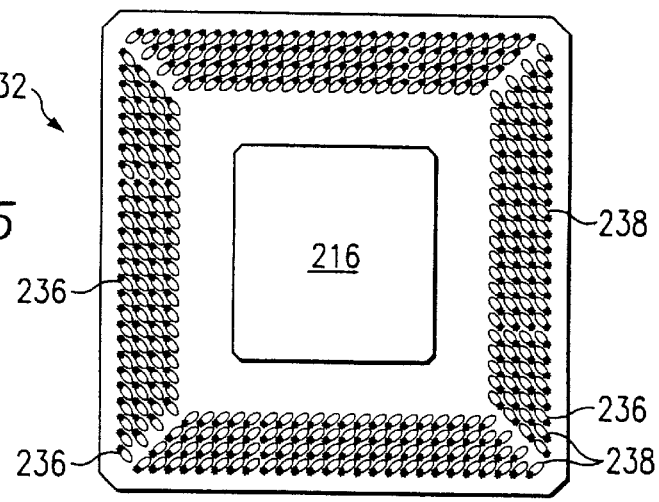
FIG. 5
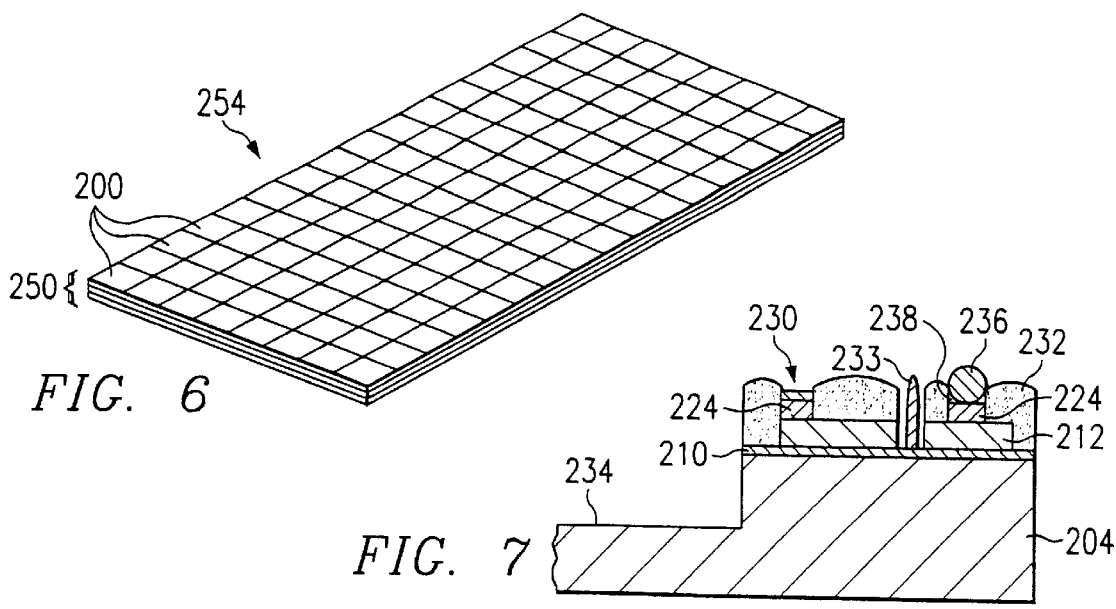
FIG. 6
FIG. 7

SUBSTRATE FOR AN INTEGRATED CIRCUIT PACKAGE

This is a continuation of application Ser. No. 09/075,286 filed May 8, 1998, U.S. Pat. No. 6,107,683, which is a continuation-in-part of application Ser. No. 08/879,549, filed Jun. 20, 1997, abandoned.

TECHNICAL FIELD

The present invention relates to an integrated circuit package and, more particularly, to a ball grid array substrate package that is sequentially built and accommodates at least one integrated circuit.

BACKGROUND OF THE INVENTION

There have been several generations of integrated circuit packages used to mount an integrated circuit. Recently, development of one such generation known as a ball grid array substrate package has exhibited several advantages over earlier generations of integrated circuit packages. Earlier generations of integrated circuit packages include ceramic and metal packaging, each of which are expensive and difficult to manufacture. The advantages associated with the ball grid array substrate package generally include: (1) eliminating the need to route package leads to the outer edges of the integrated circuit package; (2) permitting smaller packages and closer spacing of packages mounted to the same printed circuit board; and (3) shortening interconnect lengths to improve electrical performance.

Ball grid array substrate packages have been further classified into either enhanced ball grid arrays or micro ball grid arrays. The micro ball grid arrays are typically used with integrated circuits having a relatively low number of inputs and outputs. Such integrated chips include various memory chips. Typically the micro ball grid array is constructed as a single layer of tape having dimensions similar to that of the integrated chip.

The enhanced ball grid arrays are used with integrated circuits that generate more than 3 watts or have a relatively large number of inputs and outputs. A relatively large number of inputs and outputs is in the range 300 through 1000. The integrated circuits used in conjunction with enhanced ball grid arrays are generally application specific integrated circuits, digital signal processors or microprocessors.

An example of an enhanced ball grid array package is briefly discussed below and disclosed in U.S. Pat. No. 5,583,378. The '378 patent issued to Marrs et al. on Dec. 10, 1996, and is assigned to Amkor Electronics, Inc.

Referring to FIG. 1, there is illustrated a cross-sectional view of an enhanced ball grid array package 100, an integrated circuit 102 and a thermal conductor 104 all of which are described in the '378 patent. The thermal conductor 104 is typically a thin layer (i.e. 0.127 to 0.254 millimeters thick) of copper that covers the entire outer surface of the enhanced ball grid array package 100.

The thermal conductor 104 is attached to an interconnection substrate 106 by an adhesive layer 108. The interconnection substrate 106 is a multi-layered printed circuit board laminate having a well region 110 in which the integrated circuit 102 is positioned. The integrated circuit 102 may be directly attached to a surface of the thermal conductor 104 or have an optional adhesive layer 112 located therebetween.

The interconnection substrate 106 is alternately composed of at least one insulating layer 114 and at least one conductive trace layer 116 manufactured by well known methods. The number of insulating layers 114 and conductive trace layers 116 depends on the type of integrated circuit 102, the electrical design requirements, and the number of circuit interconnections required. Insulating layers 114 and conductive trace layers 116 are laminated together with epoxy resin. Conductive vias or plated through-holes 118 are then drilled or laser ablated, and plated to form conductors for electrical connections between multiple conductive trace layers 116.

A soldermask layer 120 is applied over the outermost conductive trace layer 116 and functions as an insulator. The soldermask layer 120 further includes a plurality of electrical contacts 122 that are formed by creating selective openings in the soldermask layer 120. The electrical contacts 122 are typically plated with nickel and gold and are electrically connected to the integrated circuit 102. The connections between the electrical contacts 122 and the integrated circuit 102 start with the electrical contacts that are connected by the conductive vias 118 to various conductive trace layers 116, thereafter, a plurality of bond wires 124 connect the conductive trace layers to the integrated circuit.

A plurality of solder balls 126 are attached to the electrical contacts 122 such that the enhanced ball grid array package 100 can electrically communicate with a larger electronic system such as a printed circuit mother board (not shown).

As described earlier, the integrated circuit 102 is positioned in the well region 110 which may be filled to a predetermined level with an insulating encapsulant material 128. The insulating encapsulant material 128 is typically an epoxy based plastic resin that functions to protect the integrated circuit 102 and the plurality of bond wires 124 from the outside environment.

Low yield and high manufacturing costs are disadvantages associated with the current enhanced ball grid array package 100, because glass reinforced epoxy laminate is used in the interconnection substrate 106. In addition, the current enhanced ball grid array package 100 is highly susceptible to problems during the manufacturing process such as warpage, cosmetic defects, and unreliable application of nickel and gold onto the electrical contacts 122.

Furthermore, the application of nickel and gold to the electrical contacts 122 requires a bussing network that utilizes valuable space located externally of the interconnection substrate 106. The bussing network also requires that the solder balls 126 be coated with gold, where a problem may occur when using dissimilar metals in connecting the enhanced ball grid array 100 to the printed circuit mother board that has connections typically manufactured from copper.

Accordingly there is a need for a new generation of ball grid array substrate packages that are constructed by a manufacturing process using sequential build technology. There is also a requirement to position at least one integrated circuit within a corresponding cavity formed within a metal core of the ball grid array substrate packages. These and other needs are satisfied by the ball grid array substrate package of the present invention.

SUMMARY OF THE INVENTION

The present invention is an enhanced substrate package suitable for use with a ball grid array and a method for manufacturing the same, wherein the substrate package includes a metal core having a first surface and a second surface opposite the first surface. The metal core further includes at least one cavity in which at least one integrated circuit is positioned. A dielectric layer is secured to the first surface of the metal core and includes a die cavity formed therein. Thereafter, a conductive seed layer is chemically deposited to exposed portions of the dielectric layer and the first surface of the metal core. Adjacent to the conductive seed layer, a circuit is electrolytically and selectively formed within a first circuit pattern. An electrically resistive soldermask layer may be disposed on the dielectric layer and the circuit.

According to one aspect of the invention, the first surface has an adhesion promoting electrically conductive surface layer which permits the dielectric layer to be directly attached to the core without the need for an adhesive.

According to another aspect of the invention, the dielectric layer has a outer recessed edge located along at least a portion of an outer perimeter of the metal core and/or an inner recessed edge located along at least a portion of an outer perimeter of said cavity. In each instance, the recessed edge can be covered by the soldermask layer and thereby protected from moisture ingress.

In addition, the substrate package of the invention may further include a via or through-hole extending through the thickness of the dielectric layer and the soldermask layer, and an electrical conductor extending through the via from an outer surface of the soldermask layer to an upper surface of the adhesion promoting layer, whereby the metal core can be grounded through the land.

According to the present invention there is provided a ball grid array substrate package manufactured using sequential build technology. Also in accordance with the present invention there is provided a ball grid array substrate package having a bonding area that is electrolytically and selectively formed over a portion of the circuit. In accordance with the present invention there is further provided a ball grid array substrate package the uses a differential etch process to remove a conductive seed layer. Further in accordance with the present invention there is provided a ball grid array substrate package having a bonding area selectively formed with an inner layer of nickel and an outer layer of gold in a predetermined location.

A process for manufacturing a ball grid array substrate according to the invention includes the steps of oxidizing a first surface of a metal core with an adhesion promoter, applying a dielectric to the first surface of the metal core, creating at least one die cavity within the dielectric to expose a portion of the first surface of the metal core, metallizing a conductive seed layer to an exposed portion of the dielectric layer and to at least an exposed portion of the first surface of the metal core, and electrolytically forming a circuit. Manufacturing improvements provided by the invention further include forming successive layers electrolytically without use of an adhesive, and a semi-additive metallization technique which applies a seed layer in a thickness sufficient to form a circuit thereon, then later removes the seed layer after the circuit has been formed. These and other aspects of the invention are discussed in the detailed description that follows.

BRIEF DESCRIPTION OF THE DRAWINGS

A more complete understanding of the invention may be had by reference to the following Detailed Description when taken in conjunction with the accompanying Drawings wherein:

FIG. 4 is a plan view of a pattern plate circuit and a bond area of the present invention;

FIG. 5 is a plan view of a soldermask layer; and

FIG. 6 is a perspective view of a sheet of the substrate packages prior to singulation; and FIG. 7 is a cross-sectional view of an alternative form of ball grid array substrate package of the present invention.

DETAILED DESCRIPTION OF THE DRAWINGS

Figure 1:
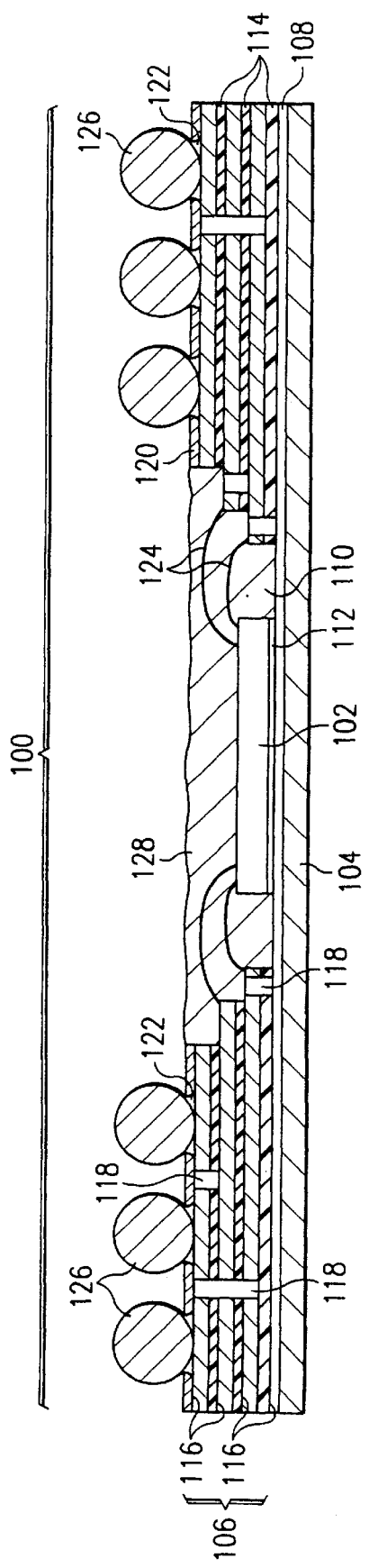
FIG. 1 is a cross-sectional view of PRIOR ART illustrating an enhanced ball grid array substrate having a thin thermal conductor.

Referring to the Drawings, wherein like numerals represent like parts throughout the several views, there is disclosed a ball grid array substrate package 200 (FIG. 3) in accordance with the present invention.

Although a preferred embodiment of the substrate package 200 manufactured using photo-imaging techniques will be described, those skilled in the art will appreciate that such manufacturing process is only one of many utilizing various sequential build technologies. Other sequential built technologies include laser ablating and plasma etching. Accordingly, the substrate package 200 described should not be construed in a limiting manner.

Figure 2A:
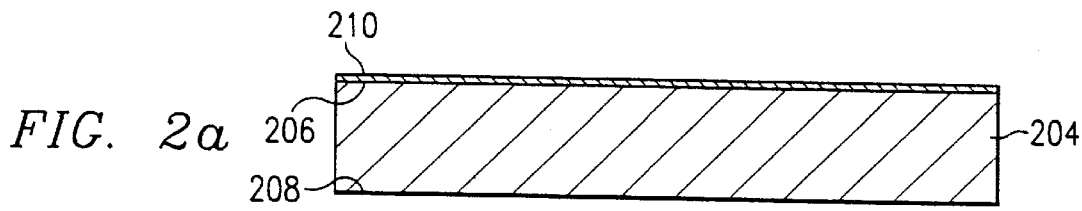
FIGS. 2a–2o are cross-sectional views of various construction levels associated with a ball grid array substrate package of the present invention.
Figure 2B:
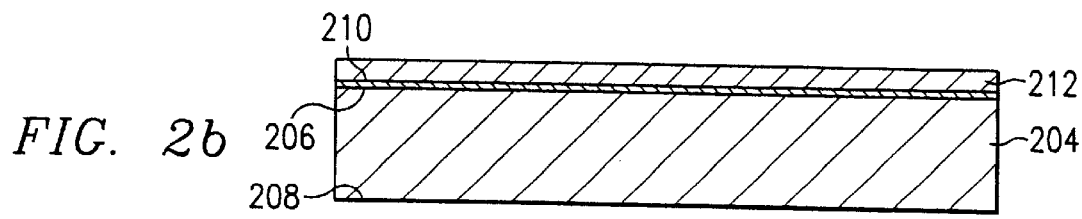
Figure 2C:
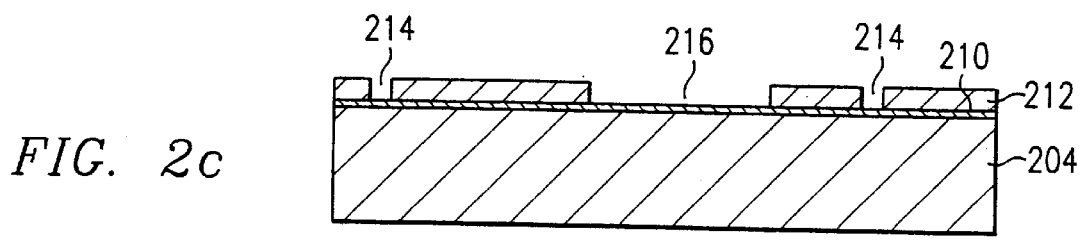
Figure 2D:
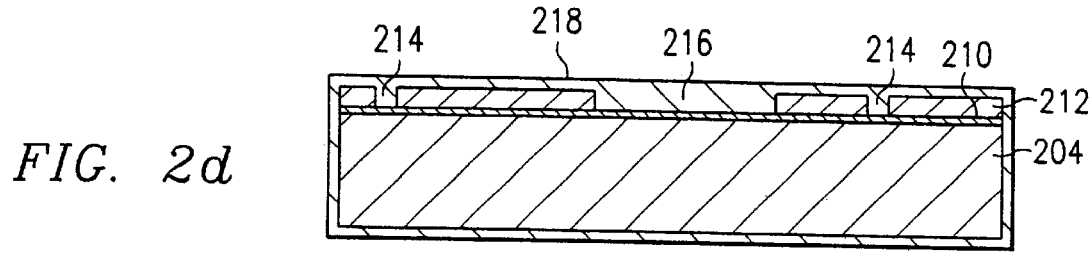
Figure 2E:
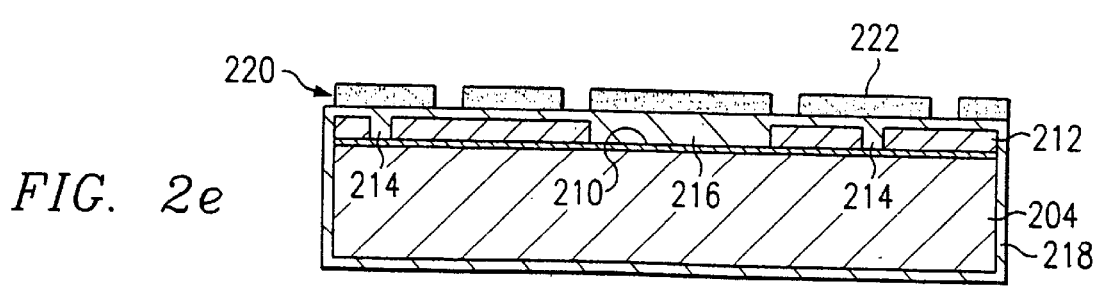
Figure 2F:
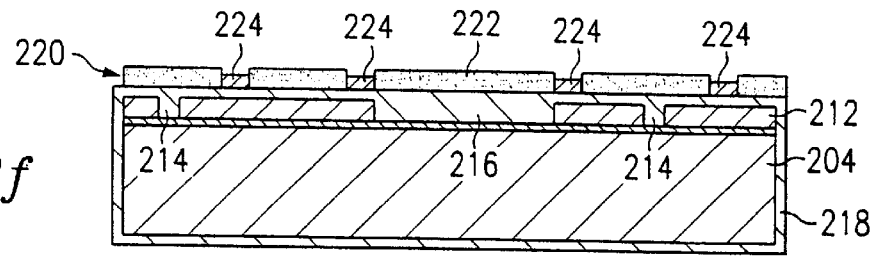
Figure 2G:
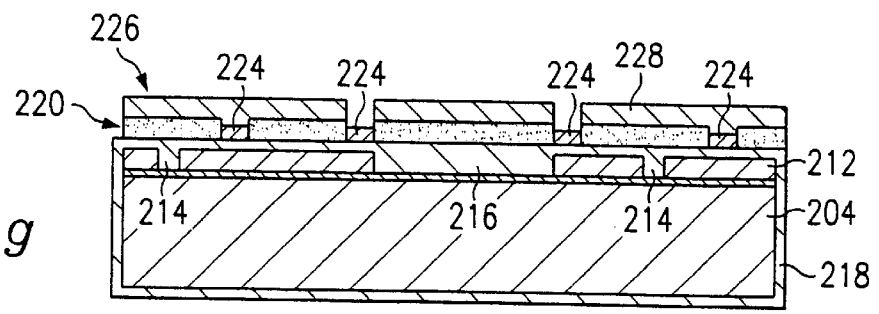
Figure 2H:
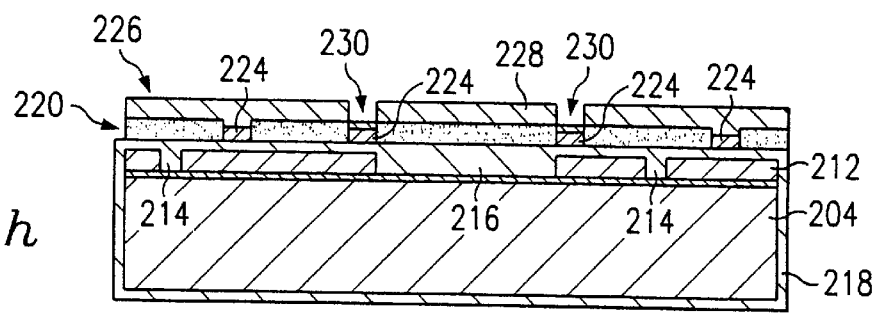
Figure 2I:
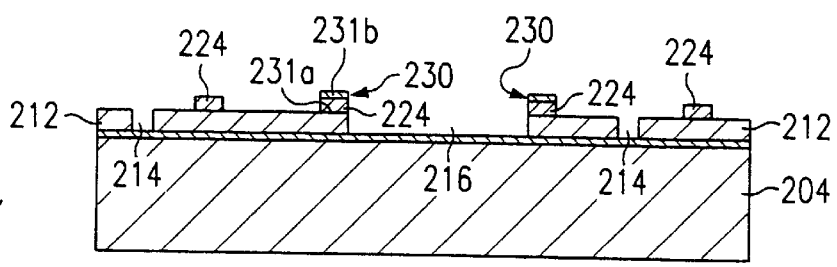
Figure 2J:
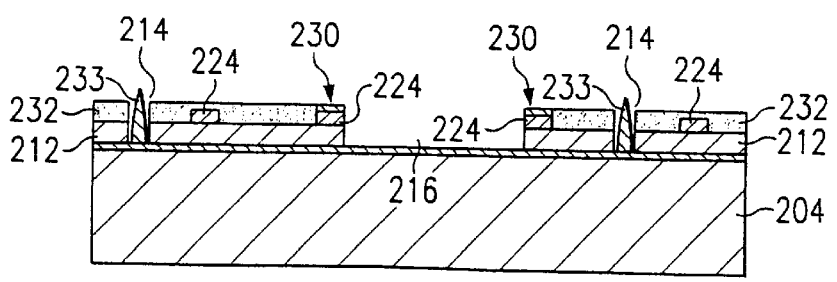
Figure 2K:
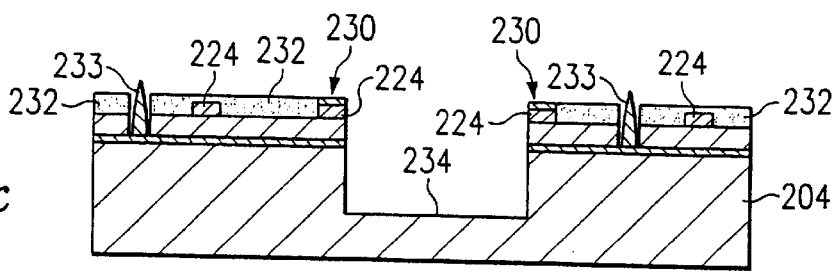
Figure 2L:
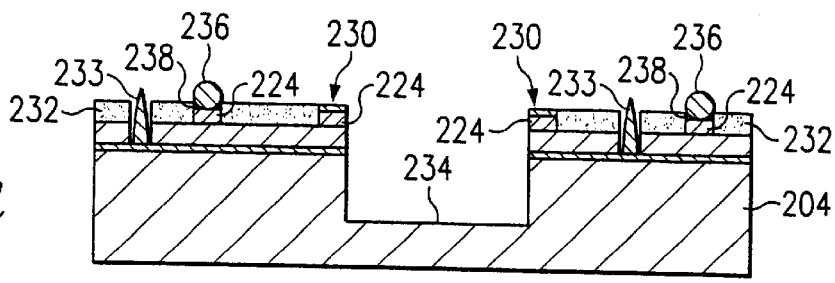
Figure 2M:
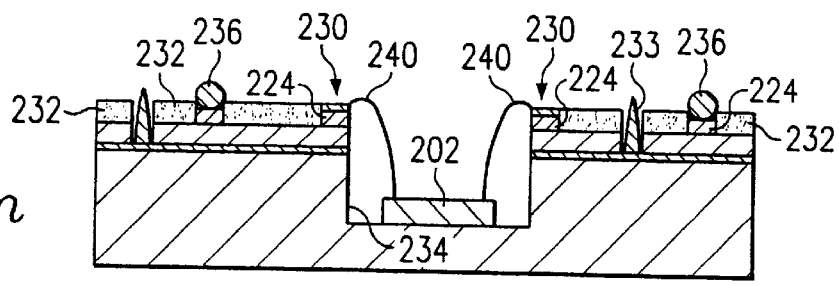
Figure 2N:
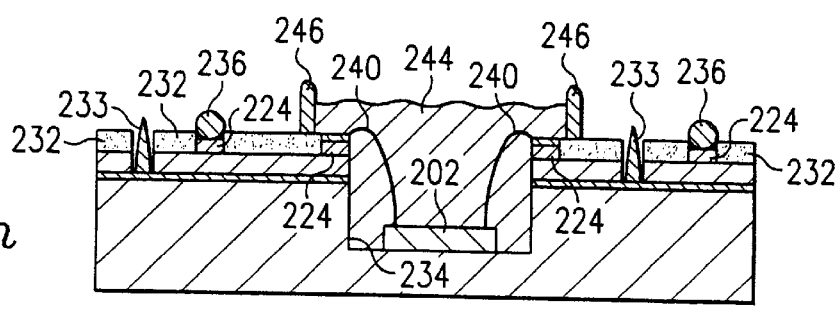
Figure 2O:
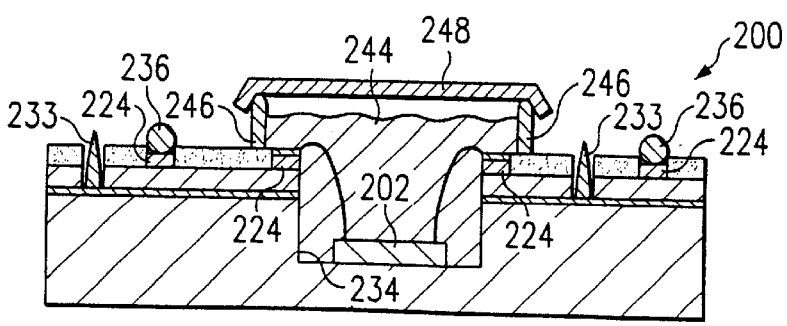

Referring to FIGS. 2a–2o, there are illustrated cross-sectional views of various construction levels associated with the substrate package 200, where FIG. 2a depicts the beginning level and FIG. 2o depicts the last level of construction; however, construction may be considered complete as early as the level illustrated in FIG. 2m.

Referring to FIG. 2a, there is illustrated a metal core 204 having a first surface 206 opposite that of a second surface 208. The first surface 206 of the metal core 204 is treated with an oxide 210 such as a reduced copper oxide that functions as an adhesive promoter. In the alternative, the upper surface of core 204 may be mechanically roughened, e.g., jet-scrubbed, or chemically micro-etched to provide a surface layer to which the dielectric layer will better adhere. Ideally, the surface promoting layer is electrically conductive to permit grounding of the core 204 therethrough, and is thus free of conventional adhesives. An adhesion promoting surface layer that maximizes surface area while minimizing grain size is optimal.

The metal core 204 is preferably constructed of an electrically conductive metal such as copper and has a thickness approximately 0.75 mm; however, other metals and dimensions are permissible. The metal core 204 in addition to providing structural integrity for the substrate package 200 also functions as a thermal heatsink and electromagnetic interference (EMI) shield.

Referring to FIG. 2b, there is illustrated a dielectric layer 212 applied to the first surface 206 of the metal core 204. The dielectric layer 212 is preferably a photoimageable polyimide that is applied as a liquid. Heat is applied, after application of the liquid polyimide, to solidify the dielectric layer 212. In the alternative, the dielectric can be applied as a solid film, which is then softened by application of heat and then vacuum-formed so that it becomes directly bonded to core 204, particularly the adhesion promoting layer on its surface, without need of an intervening layer of a conventional adhesive. The dielectric layer 212 generally has a cured thickness of 0.002" which is less than ¹⁄₁₆th of the overall thickness of the substrate package 200.

Although the dielectric layer 212 is polyimide based and has a greater tendency to absorb moisture than glass reinforced B-staged epoxy material, the polyimide dielectric layer 212 is less subject to warpage as is the epoxy material commonly used in conventional enhanced ball grid array substrate packages. Also, the thin nature of the dielectric layer 212 allows for an edge and/or an inner edge of the dielectric layer to be recessed and then encapsulated with a soldermask 232 (see right side of FIG. 3) to minimize potential paths for moisture ingress. FIG. 7 shows an embodiment with more extensive overlap of soldermask 232 on both edges.

Soldermask 232 is preferably made of an electrically resistive acrylic-based epoxy such as Ciby-Geigy Probimer 52 that has a low acrylic content. This provides less brittleness and more flexibility, so that the substrate package is less likely to fail during subsequent operations such as thermal wire banding. The recessed edge or inner recessed edge may be formed by photolithography or a similar process. The recessed edge or inner recessed edge may also be formed within a single and/or multi-layer substrate package 200.

Referring to FIG. 2c, there is illustrated the dielectric layer 212 having a pair of vias 214 and a die cavity 216 formed therein. Depending on the application, there may be any number of vias 214 or die cavities (large vias) 216 formed. Photolithography is the preferable process used in creating the vias 214 and the die cavity 216. The photolithography process includes the photographic transfer of a pattern to the surface of the dielectric layer 212, where the pattern is then developed out to form the vias 214 and die cavity 216.

The use of the same photodefinition operation to recess the dielectric layer 212 to form the vias 214 and die cavity 216 provides for a significant improvement in machinability and reliability when compared to forming the laminate layers of conventional packages.

Referring to FIG. 2d, there is illustrated a conductive seed layer 218 adhered to the surfaces of the dielectric layer 212 and the oxide layer 210, where the dielectric layer is activated. Successful application of the conductive seed layer 218 is generally determined by peel strength and consistent plating distribution of the conductive seed layer. Peel strength is a quantity that refers to how well the conductive seed layer 218 adheres to the dielectric layer 212. A peel strength in the range of, for example, 6–7 lbs/sq.in. is adequate.

The conductive seed layer 218 may be applied by an electroless process or direct plating process, where each process is coupled with a copper flash. An extremely thin (e.g., 10–100 angstroms) layer of palladium-tin is first laid down, followed by a substantially thicker layer of copper. Substantially consistent plating distribution is required because the conductive seed layer 218 is removed in a uniform manner during a differential etch process, described later with reference to FIG. 2i. The conductive seed layer 218 preferably has a thickness of approximately 5 μm and a distribution of +/−0.5 μm.

Referring to FIG. 2e, there is illustrated a first circuit pattern 220 adhered to and created upon the conductive seed layer 218. The creation of the first circuit pattern 220 includes the steps of applying a first resistive layer 222, photo-imaging and then developing out the first resistive layer 222. Initially, the first resistive layer 222 is applied over the entire surface of the dielectric layer 212. The photo-imaging step further includes the photographic transfer of a predetermined pattern to the surface of the first resistive layer 222, where the predetermined pattern is then developed out to form the first circuit pattern 220.

Referring to FIG. 2f, there is illustrated a circuit 224 electrolytically formed within the first circuit pattern 220. The circuit 224 is preferably manufactured from an electrically conductive metal such as copper and may be referred to as a pattern plate circuit. The electrolytic process is possible because of the presence and use of the conductive seed layer 218, where the conductive seed layer functions as a bus or conductor of electricity. The creation of the first circuit pattern 220 and the circuit 224 may be referred to as a semi-additive process, where the conductive seed layer 218 functions as a bussing mechanism. The circuit 220 will be described later in further detail with reference to FIG. 5.

Referring to FIG. 2g, there is illustrated a second circuit pattern 226 adhered to and created upon the first circuit pattern 220. The creation of the second circuit pattern 226 includes the steps of applying a second resistive layer 228, photo-imaging and then developing out the second resistive layer 228 and the first resistive layer 222. Initially, the second resistive layer 228 is applied over the entire surface of the first resistive layer 222. Resistive layers 222, 228 may, for example, be made of a Dupont Riston dry film photoresist resin. The process of creating the second circuit pattern 226 is very similar to the creation of the first circuit pattern 220.

Referring to FIG. 2h, there is illustrated a bond area or layer 230 electrolytically formed within the second circuit pattern 226. Again, the electrolytic process is possible because of the presence and use of the conductive seed layer 218. The bond layer 230 is generally created around a perimeter of each die cavity 216 and over a portion of the circuit 224; however, other routes are permissible. The bond area 230 is generally made of an inner layer 231a of nickel (FIG. 2i) with an outer layer 231b of gold (FIG. 2i).

Referring to FIG. 2i, there is illustrated the results of a differential etch process or mild micro-etch persulfate solution wherein the conductive seed layer 218, the first circuit pattern 220 and the second circuit pattern 226 are removed. The circuit 224 settles onto the dielectric layer 212, because removal of the conductive seed layer 218 that is relatively thin does not substantially affect the position of the circuit. The entire substrate package 200 is subject to the differential etch process which permits finer line resolution and greater image quality.

The differential etch process is essentially a chemical attack upon the thickness between the electroless and electrolytic layers of the substrate package 200. The differential etch process is possible due to the limited thickness of the conductive seed layer 218. During the process, the conductive seed layer 218 is removed in an substantially uniform manner, therefore, the even plating distribution is important.

Referring to FIG. 2j, there is illustrated a soldermask 232 layered over the circuit 224 and the dielectric layer 212. The soldermask 232 is constructed of a UV-curable polymeric insulating material such as an epoxy as is well known in the art. Since the soldermask need not be as pure as the dielectric layer 212, it can be made of a different, less pure resin. The vias 214 and the die cavity 216 usually have a clear path extending through the soldermask 232. The clear path associated with each via 214 has a solder land 233 positioned therein. The soldermask 232 will be described later in further detail with reference to FIG. 4.

Referring to FIG. 2k, there is illustrated a cavity 234 formed within the metal core 204. The depth of the cavity 234 may be customized by using standard routing equipment with Z-axis controlled depth milling. The cavity 234 may be formed by mechanical and/or chemical milling. The conductive nature of sidewalls of the cavity 234 function to enhance the electrical performance by providing additional electromagnetic interference shielding. Depending on the particular application there may be a plurality of cavities 234 (See FIG. 3).

Referring to FIG. 2l, there is illustrated the connection of a plurality of solder balls 236 via electrical contacts 238 to the circuit 224. A plurality of holes are created in the soldermask 232 by photolithography or a similar process in which the solder balls 236 and electrical contacts 238 are disposed. The solder balls 236 are connected to the circuit 224 as illustrated with more detail with reference to FIGS. 4 and 5. The application of the solder balls 236 may have been completed prior to the routing of the cavity 234.

Referring to FIG. 2m, there is illustrated the integrated circuit 202 positioned within the cavity 234. The integrated circuit 202 is connected to the bond area 230 by a plurality of bond wires 240. The bond wires 240 are typically thermosonic bonds that connect a particular area on the integrated circuit 202 to the bond area 230 (FIG. 4).

Referring to FIG. 2n, there is illustrated an electrically insulating encapsulant material 244 applied over the integrated circuit 202 and the bond wires 240. The encapsulant material 244 is preferably an epoxy based plastic resin and may be applied to any desired level such to encapsulate the integrated circuit 202. If required, a rim in the form of a resin dam 246 may be used to aid in the application and containment of the encapsulant material 244. The resin dam 246 is generally positioned over the soldermask 232 and around the perimeter of the cavity 234. The encapsulant material 244 helps protect the integrated circuit 202 and the bond wires 240 from the outside environment.

Referring to FIG. 2o, there is illustrated a lid 248 positioned over an opening created by the resin dam 246. The use of a lid 248 is optional and may aid in further protection from the outside environment. The use of the lid 248 or the encapsulant material 244 may be alone or in combination with one another depending upon the particular application.

Figure 3:
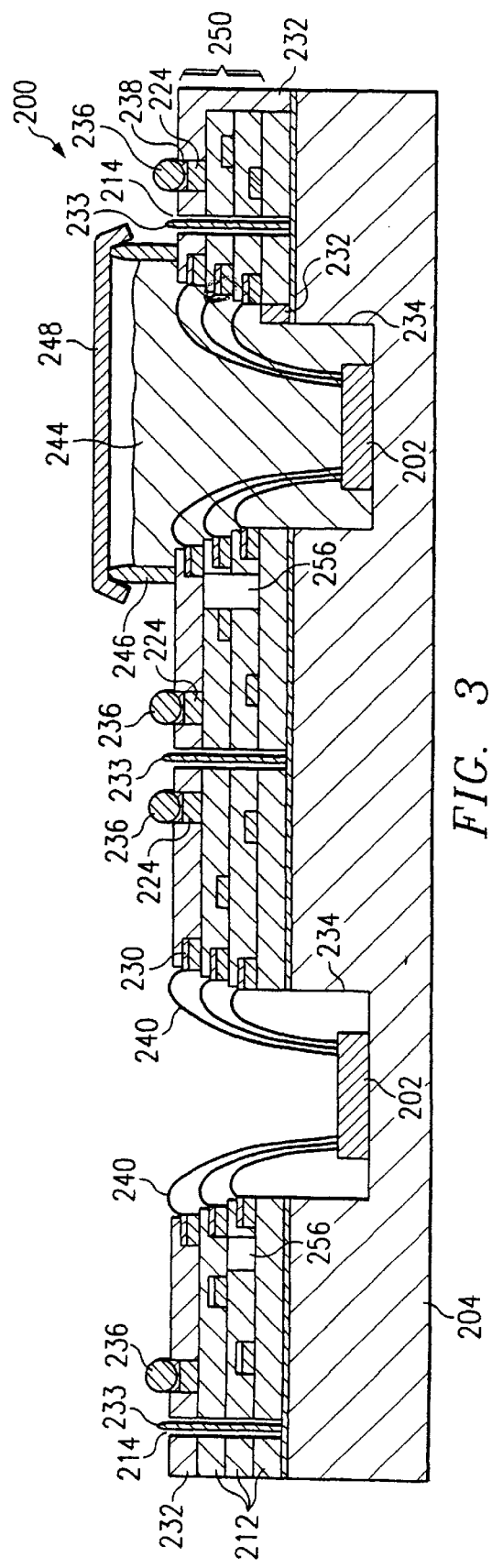
FIG. 3 is a cross-sectional view of the substrate package having multiple layers of circuitry.

Referring now to FIG. 3, there is illustrated the substrate package 200 having multiple layers of circuitry 250. Each layer of the multiple layers of circuitry 250 includes the consecutive repetition of the construction steps including the application of the dielectric layer 212 (FIG. 2b) through the differential etch process (FIG. 2i). The steps between and including the dielectric layer 212 and the differential etch process have been described-above. In addition, individual blind vias 256 may be formed within and to various depths in the multiple levels of the dielectric layers 212. The individual blind vias 256 and/or vias 214 are plated to form conductors to provide additional electrical connections between each layer of the multiple layers of circuitry 250. The vias 214 and the blind vias 256 may also be screen filled with a conductive material. The vias 214 that are plated and connected to the metal core 204 effectively turn the metal core 204 into a ground layer.

Use of the encapsulant material 244 within the cavity 234 is optional. The resin dam 246 and lid 248 may be used even if the encapsulant material 244 is not utilized. Thereafter, the construction of the substrate package 200 may be completed as described earlier with reference to FIG. 2j through FIG. 2o.

Referring to FIG. 4, there is illustrated a plan view of the circuit 224 and the bond area 230. The circuit 224 includes a plurality of conductive traces 252. The circuit 224 also includes the plurality of vias 214, blind vias 256 and the die cavity 216 that were described earlier. The bond area 230 includes the outer layer of gold 231b on which the bond wires 240 are attached thereto. The conductive traces 252 electrically connect the vias 214 and 256 to the outer layer of gold 231b thus forming a predetermined circuit.

Referring now to FIG. 5, there is illustrated a plan view of the soldermask 232. The soldermask 232 includes the electrical contacts 238 formed by creating selective openings in the soldermask 232. The electrical contacts 238 will expose selective portions of the circuit 224. Each electrical contact 238 may correspond and be electrically connected to the circuit 224. Solder balls 236 (FIG. 2l) are then connected to the electrical contacts 238 and, thereafter, the substrate package 200 can be electrically connected to a larger electronic system such as a printed circuit mother board.

Referring to FIG. 6, there is illustrated a perspective view of a sheet 254 containing a plurality of the substrate packages 200 having multiple layers of circuitry 250. The sheet 254 typically has the dimensions of 9" by 12"; however, other dimensions are permissible. Each substrate package 200 is marked and singulated or cut from the sheet 254.

While the present invention has been described with reference to the illustrated embodiment, it is not intended to limit the invention but, on the contrary, it is intended to cover such alternatives, modifications and equivalents as may be included in the spirit and scope of the invention as defined in the following claims.

What is claimed is:

1. A substrate for an integrated circuit package, comprising:
   a metal core, the metal core including a surface treated in a manner effective to promote adhesion to the surface by a dielectric;
   a dielectric layer adhered to the treated surface of the metal core, the dielectric layer including at least one cavity, the cavity exposing a portion of the treated surface of the metal core; and
   a circuit on the metal core.

2. The substrate of claim 1, wherein the metal core comprises a roughened surface to promote the adhesion of the dielectric to the surface.

3. The substrate of claim 1, wherein the core consists essentially of copper, the surface of the core including an electrically conductive, adhesion promoting surface layer thereon.

4. The substrate of claim 1, further comprising:
   an electrically resistive soldermask on the circuit; and
   exposed bond areas on the circuit, which bond areas are positioned proximate the cavity.

5. The substrate of claim 4, further comprising:
   holes formed in the soldermask at locations corresponding to electrical contacts on the circuit; and
   solder balls connected to the circuit at the electrical contacts.

6. The substrate of claim 5, further comprising:
   at least one via extending through the dielectric and soldermask layer; and
   a conductor extending through the via from an outer surface of the soldermask layer to a surface of the metal core, whereby the metal core may be grounded.

7. An integrated circuit package substrate including:
   a core, a dielectric layer on a core, the dielectric layer defining a cavity for receiving an integrated circuit, the dielectric layer further comprising an inner edge adjoining the cavity;

a circuit on the dielectric layer, and a soldermask layer over the dielectric layer and the circuit, the improvement comprising;

a recessed outer edge of the dielectric layer, which outer edge is inwardly offset from an outer edge of the underlying core; and a portion of the soldermask covering the outer recessed edge of the dielectric layer.

8. The substrate of claim 1, further comprising:

an inner edge of the dielectric layer outwardly recessed from the cavity; and a portion of the soldermask covering the inner recessed edge.

9. The substrate of claim 7, further comprising:

an integrated circuit positioned in the cavity;

conductors connecting the integrated circuit being connected to the circuit formed on the dielectric layer; and an encapsulant material filling at least a portion of the cavity, the encapsulant material covering the integrated circuit and conductors.

10. The substrate of claim 7, further comprising:

a portion of the cavity extending into the core;

an integrated circuit in the cavity;

conductors connecting the integrated circuit being connected to the circuit formed on the dielectric layer; and an encapsulant material filling at least a portion of the cavity, the encapsulant material covering the integrated circuit and conductors.

11. The substrate of claim 7, wherein the core is made of a conductive metal, and, an electrically conductive surface layer on the core that promotes direct adhesion of the dielectric layer to the core.

12. A substrate for an integrated circuit package, including:

(a) a core (b) a dielectric layer on a surface of a core, which dielectric layer includes a cavity configured to receive an integrated circuit;

(c) a conductive seed layer covering the dielectric layer and cavity;

(d) a first resistive layer formed on the conductive seed layer having openings therethrough defining a first circuit pattern;

(e) a first circuit formed within the circuit pattern using the conductive seed layer.

13. The substrate of claim 12, wherein the core is made of a conductive metal, and an electrically conductive surface layer on the core that promotes direct adhesion of the dielectric layer to the core.

14. The substrate of claim 13, further comprising:

a soldermask layer over the first circuit;

bond areas exposed through the soldermask layer on the first circuit;

a via through the dielectric layer and soldermask layer at a location spaced from the first circuit; and a conductive material filling the via, the conductive material capable of acting as a ground for the metal core.

15. The substrate of claim 12, further comprising:

a second resistive layer, formed on the first resistive layer, the second resistive layer having openings therethrough;

a second circuit pattern defined by the openings through the second resistive layer; and a second circuit within the second circuit pattern on top of the first circuit pattern dielectric layer.

16. The substrate of claim 15, further comprising a soldermask layer over the first circuit; and bond areas defined by holes in soldermask, the holes exposing one or more areas of the second circuit.

17. The substrate of claim 16, further comprising:

a portion of the cavity extending into the metal core;

terminals on the first circuit at locations spaced from the bond areas;

an integrated circuit in the cavity in contact with the core;

electrical conductors which extend through the cavity; the electrical conductors connecting the integrated circuit to the bond areas; and an encapsulant sealing the integrated circuit, conductors and bond areas.

18. The substrate of claim 17, wherein the terminals on the first circuit comprise solder balls connected to the first circuit.

19. The substrate of claim 12, wherein the conductive seed layer further comprises:

a layer of palladium-tin having a thickness in the range of about 10–100 angstroms on the dielectric layer and cavity; and a layer of copper on the palladium-tin layer, which copper layer is thicker than the palladium-tin layer.

* * * * *